United States Patent
Kim (10) Patent No.: US 7,711,862 B2
(45) Date of Patent: May 4, 2010

(54) DATA PROCESSING APPARATUS AND PROGRAM DATA SETTING METHOD THEREOF

(75) Inventor: Young-chan Kim, Uiwang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 405 days.

(21) Appl. No.: 11/520,725

(22) Filed: Sep. 14, 2006

(65) Prior Publication Data

US 2007/0168906 A1 Jul. 19, 2007

(30) Foreign Application Priority Data

Jan. 19, 2006 (KR) .................. 10-2006-0005996

(51) Int. Cl.
G06F 3/00 (2006.01)
G06F 13/28 (2006.01)
G06F 5/00 (2006.01)

(52) U.S. Cl. .................. 710/8; 710/28; 710/36; 710/51

(58) Field of Classification Search ............... None
See application file for complete search history.

(56) References Cited

U.S. PATENT DOCUMENTS

| | | | |
|---|---|---|---|
| 5,278,759 A | | 1/1994 | Berra et al. |
| 6,023,570 A | * | 2/2000 | Tang et al. .................. 716/17 |
| 6,151,657 A | | 11/2000 | Sun et al. |
| 6,389,321 B2 | * | 5/2002 | Tang et al. .................. 700/2 |
| 6,408,432 B1 | * | 6/2002 | Herrmann et al. .......... 717/139 |
| 6,446,176 B1 | * | 9/2002 | West et al. .................. 711/162 |
| 2002/0008542 A1 | | 1/2002 | Tsai et al. |
| 2002/0070753 A1 | * | 6/2002 | Vogel et al. .................. 326/37 |
| 2003/0110346 A1 | | 6/2003 | Katahira |
| 2003/0179771 A1 | * | 9/2003 | Chan et al. .................. 370/445 |

FOREIGN PATENT DOCUMENTS

| | | |
|---|---|---|
| CN | 1658142 | 8/2005 |
| JP | 06-175874 | 6/1994 |
| JP | 11-039184 | 2/1999 |
| KR | 1998-044103 | 9/1998 |
| KR | 2003-0077123 | 10/2003 |

OTHER PUBLICATIONS

Chinese Office Action dated Jun. 6, 2008 issued in CN 2006-10146310.X.
European Search Report issued Dec. 30, 2008 in EP Application No. 06076896.7.

* cited by examiner

*Primary Examiner*—Henry W. H. Tsai
*Assistant Examiner*—Kris Rhu
(74) *Attorney, Agent, or Firm*—Stanzione & Kim, LLP

(57) ABSTRACT

A data processing apparatus and a program data setting method that can minimize a manufacturing cost. The data processing apparatus includes a plurality of In System Programming (ISP) devices to store program data used to drive the data processing apparatus, a connector to receive the program data from an external program providing device, and a switch to switch a connection between the connector and the plurality of ISP devices. The data processing apparatus can adjust the connection between the connector and the plurality of ISP devices using the switch. Accordingly, the data processing apparatus does not require an additional connector or a separate program to distribute the program data received at the connector to each ISP device so that the manufacturing cost can be minimized and a structure can be simplified.

24 Claims, 5 Drawing Sheets

DATA PROCESSING APPARATUS AND PROGRAM DATA SETTING METHOD THEREOF

CROSS-REFERENCE TO RELATED APPLICATIONS

This application claims the benefit of Korean Patent Application No. 2006-5996 filed on Jan. 19, 2006, in the Korean Intellectual Property Office, the disclosure of which is incorporated herein by reference in its entirety.

BACKGROUND OF THE INVENTION

1. Field of the Invention

The present general inventive concept relates to a data processing apparatus and a program data setting method thereof. More particularly, the present general inventive concept relates to a data processing apparatus that can set program data in each micom without requiring separate programs, and a program data setting method thereof.

2. Description of the Related Art

Generally, a data processing apparatus such as a television and a monitor, which processes predetermined data, includes a plurality of micoms (i.e., micro computers). Each micom has various programs required to drive the data processing apparatus.

The data processing apparatus downloads data for a program (i.e., program data) or a data table corresponding to each micom from an exterior device and stores the downloaded data. Each micom is connected through a connector with the exterior device to download the data.

Conventionally, each micom is connected with the exterior device by either (1) providing connectors to corresponding ones of the plurality of micoms; (2) setting one micom as a main micom to connect the other micoms to the connector through the main micom; or (3) providing a bus to directly connect the connector to each of the plurality of micoms.

If the connectors are provided for each micom, the number of the connectors also increases according to the number of the micoms, thereby increasing the manufacturing cost of the data processing apparatus. If each micom is connected to one connector through the main micom, a separate program is required in the main micom in order to transmit the data received from the exterior device to the other micoms according to a request from the exterior device. Accordingly, the manufacturing cost increases, and the main micom is overloaded.

Additionally, if the plurality of micoms share one connecting bus connected to the connector, the exterior device should use an address of a micom in order to distinguish each micom. However, since each micom is assigned the same address by a micom manufacturing company, address confusion and/or a collision may occur.

SUMMARY OF THE INVENTION

Accordingly, the present general inventive concept provides a data processing apparatus that can set program data in a plurality of micoms using a single connector.

The present general inventive concept also provides a method of setting the program data in the data processing apparatus.

Additional aspects of the present general inventive concept will be set forth in part in the description which follows and, in part, will be obvious from the description, or may be learned by practice of the general inventive concept.

The foregoing and/or other aspects of the present general inventive concept may be achieved by providing a data processing apparatus including a connector, a first In System Programming (ISP) device, a second ISP device, and a switch.

The connector is connected to an external program providing device to transmit and receive program data to and from the external program providing device. The first ISP device stores the program data received from the external program providing device through the connector. The second ISP device is connected to the first ISP device to store the program data received from the external program providing device through the connector. The switch is connected to the connector to switch a connection between the connector and the first and the second ISP devices so that one of the first and the second ISP devices is connected to the connector in response to a control of the first ISP device.

The second ISP device may have a status value that varies depending on whether the program data is downloaded, and the first ISP device may detect the status value of the second ISP device to determine a current status of the second ISP device.

The data processing apparatus may further include a first signal line part connected to the connector, a second signal line part connected to the second ISP device, and a third signal line part connected to the first ISP device. The switch is connected to the first signal line part to switch the first signal line part to one of the second and the third signal line parts in response to the control of the first ISP device.

The switch may set a connection between the first signal line part and the third signal line part to a basic connection.

The second ISP device may have a plurality of the second ISP device. In response to the control of the first ISP device, the switch may connect one of the plurality of the second ISP devices to the connector.

The foregoing and/or other aspects of the present general inventive concept may also be achieved by providing a data processing apparatus, including a first ISP device, a second ISP device to communicate with the first ISP device, a connector connectable to an external device, a data line connected between the connector and the first and second ISP devices, and a clock line selectively connected between the connector and one of the first and second ISP devices.

The foregoing and/or other aspects of the present general inventive concept may also be achieved by providing a data processing apparatus, including a connector having first clock and data lines connectable to an external device, a first ISP device, a second ISP device, second clock and data lines connected to the first clock and data lines of the connector, respectively, the second data line connected to the first ISP device, third clock and data lines connected to the second ISP device, the third data line connected to the second data line, a fourth clock line connected to the second ISP device, and a switch having a first terminal connected to the second clock line, a second terminal connected to the fourth clock line, and a third terminal connected to the third clock line. The first ISP device controls the switch to connect the second clock line to one of the fourth clock line and the third clock line.

The switch has a first terminal connected to the second clock line, a second terminal connected to the fourth clock line, and a third terminal connected to the third clock line. The first ISP device controls the switch to connect the first terminal to one of the second and the third terminals.

The foregoing and/or other aspects of the present general inventive concept may also be achieved by providing a data processing apparatus to execute program data, the apparatus including a plurality of micro computers to download a plurality of corresponding program data from a program data providing device, a connector connectable to the program data providing device, and a switch to establish a connection between the connector and a selected one of the micro computers such that the selected one of the micro computers communicates with the program data providing device. A predetermined one of the micro computers manages operation of the switch with respect to the other micro computers.

The foregoing and/or other aspects of the present general inventive concept may also be achieved by providing a data processing apparatus, including a plurality of micro computers, a connector to communicate with a program data providing device outside of the apparatus, and a switch having a plurality of switching terminals and being interposed between the micro computers and the connector and to selectively connect the micro computers to the connector.

The foregoing and/or other aspects of the present general inventive concept may also be achieved by providing a control micro computer to manage communication between a data processing apparatus and an external program providing device. The data processing apparatus has a plurality of micro computers including the control micro computer installed therein, a connector, and a switch connected to the connector and selectively connected to the plurality of micro computers. The control micro computer manages the communication by controlling the switch to connect a selected one of the micro computers with the connector according to one or more status indicators of the plurality of micro computers and one or more commands received from the external program providing device.

The foregoing and/or other aspects of the present general inventive concept may also be achieved by providing a method of setting program data in a data processing apparatus connected to an external program providing device to provide the program data, the method including downloading the program data received through a connector from the external program providing device to a first ISP device connected to the connector, if the downloading to the first ISP device is completed, switching a first connection between the connector and the first ISP device to a second connection between the connector and a second ISP device to connect the second ISP device with the external program providing device through the connector, and changing a current status value of the second ISP device.

The method of setting program data may further include detecting the status value of the second ISP device to confirm a downloading completion of the second ISP device, and switching a connection between the connector and the second ISP device to connect the connector to the first ISP device.

The foregoing and/or other aspects of the present general inventive concept may also be achieved by providing a method of controlling a data processing apparatus having a plurality of micro computers, a connector connected with a program data providing device outside of the apparatus, and a switch interposed between the micro computers and the connector to selectively connect the micro computers to the connector. The method includes controlling the switch to selectively connect a selected one of the micro computers to the connector in response to one or more commands received from the program data providing device and one or more status indicators corresponding to the micro computers.

BRIEF DESCRIPTION OF THE DRAWINGS

These and/or other aspects of the present general inventive concept will become apparent and more readily appreciated from the following description of the embodiments, taken in conjunction with the accompanying drawings of which.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 1:
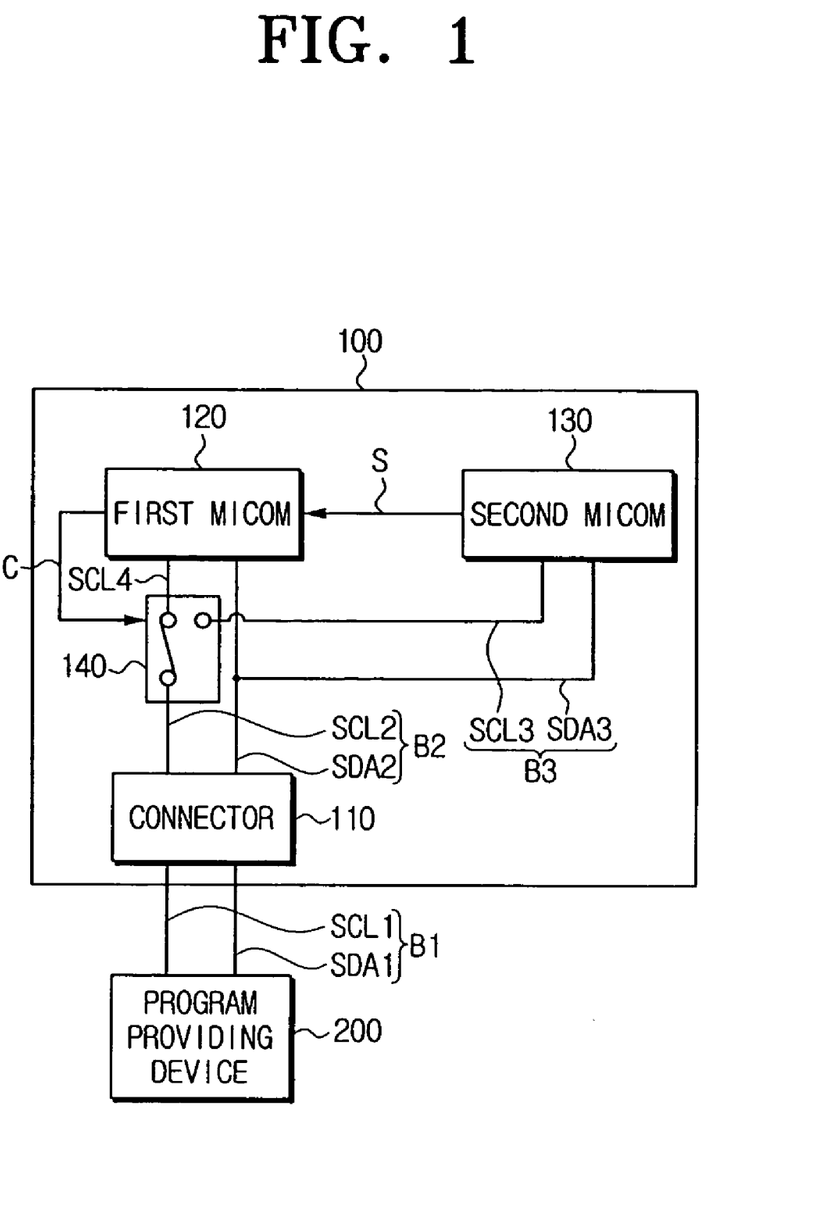
FIG. 1 is a block diagram illustrating a data processing apparatus according to an embodiment of the present general inventive concept.

FIG. 1 is a block diagram illustrating a data processing apparatus 100 according to an embodiment of the present general inventive concept.

Referring to FIG. 1, the data processing apparatus 100 includes a connector 110, a first micom (i.e., micro computer) 120, a second micom 130, and a switch 140.

In the present embodiment, the switch 140 may be a three terminal switching device. Alternatively, in other embodiments in which the number of micoms is increased, the switch 140 can be a multi-terminal device.

The switch 140 may include a plurality of switching terminals corresponding to the connector 110, the first micom 120, and the second micom 130. The switching terminal of the connector 110 can be connected to one of the switching terminals of the first and second micoms 120 and 130 by a switching part (not shown) that can be alternated between a first state (in which the switching terminals of the connector 110 and the first micom 120 are connected) and a second state (in which the switching terminals of the connector 110 and the second micom 130 are connected). The switch 140 may be a transistor, a fuse, or other devices.

More specifically, the connector 110 is connected to a program providing device 200 (i.e., an external program providing device) to transmit and receive data to and from the program providing device 200.

The program providing device 200 has program data to be set in each of the first and second micoms 120 and 130. The program providing device 200 provides the program data corresponding to each of the first and second micoms 120 and 130 to each of the first and second micoms 120 and 130. Here, the program data may be a basic program such as an operating program, which is operated in the data processing apparatus 100. For example, the program data may be one of a program source, data table to dump the program source, and/or data including the program source and the data table.

The connector 110 and the program providing device 200 are connected through a first bus B1.

The first bus B1 includes a first serial clock line (hereafter, referred to as 'SCL') SCL 1 and a first serial data line (hereafter, referred to as 'SDA') SDA 1. The first SCL SCL 1 transmits a sync clock signal to transmit and receive data between the connector 110 and the program providing device 200. The first SDA SDA1 transmits actual data between the connector 110 and the program providing device 200. For example, the first SDA SDA1 receives the program data from the program providing device 200 to provide the program data to the connector 110, and transmits and receives Ack signal (e.g., a signal indicating a receipt of recognizable data) between the connector 110 and the program providing device 200.

The first and the second micoms 120 and 130 are kinds of In System Programming (ISP) devices which can store programs. The first and the second micoms 120 and 130 are electrically connected to the connector 110 to transmit and receive data through the connector 110 to and from the program providing device 200. Here, the first micom 120 may serve as a main micom (i.e., a control micom) and the second micom 130 may serve as a sub micom (i.e., a non-control micom) among micoms of the data processing apparatus 100, or vice versa. It should be understood that although first and second micoms 120 and 130 are illustrated in FIG. 1, more than two micoms may be included in the data processing apparatus 100.

The first and the second micoms 120 and 130 each store program data provided by the program providing device 200 and sets the program data. The data processing apparatus 100 executes a certain program using the program data stored in the first and the second micoms 120 and 130. The program data stored in the first and the second micoms 120 and 130 are different from each other and may be specific to the respective micom.

The first and the second micoms 120 and 130 each have a respective identification (hereafter referred to as 'ID') to distinguish the first and second micoms 120 and 130 (i.e., corresponding to first and second IDs, respectively) from each other. The second micom 130 stores a status value to indicate a current status, and the status value varies depending on whether the program data is set therein. The first micom 120 detects the status value of the second micom 130 to determine the current status of the second micom 130. The status value can be one of two values (e.g., high or low). The status value of the second micom 130 can be provided to the first micom 120 as a status signal "S."

In the present embodiment, the data processing apparatus 100 has one second micom 130; however, it should be understood that the number of the second micoms 130 can be increased.

The first and the second micoms 120 and 130 are connected to the connector 110 by a switching operation of the switch 140 so that the first and second micoms 120 and 130 can be selectively connected to the program providing device 200.

In the present embodiment, the switch 140 is connected to one first micom 120 and one second micom 130 as the switch 140 switches. However, it should be understood that the number of the second micoms 130, which is selectively connected by the switch 140, may be increased.

The switch 140 switches the connection between the connector 110 and the first and the second micoms 120 and 130 in response to a control signal "C" of the first micom 120. The control signal "C" includes a plurality of control signals depending on the number of the second micoms 130. Here, the control signal "C" includes first and second control signals. For example, when the first micom 120 provides the first control signal to the switch 140, the switch 140 connects the connector 110 with the first micom 120. Similarly, when the first micom 120 provides the second control signal to the switch 140, the switch 140 connects to the connector 110 with the second micom 130. The second micom 130 provides the status signal "S" to the first micom 120 to indicate the status thereof.

In particular, the switch 140 is connected to the connector 110 through a second bus B2, which transmits and receives data between the first and the second micoms 120 and 130 and the connector 110. The second bus B2 includes a second SCL SCL2 and a second SDA SDA2 that are electrically connected to the connector 110. The second SDA SDA2 is connected to the first micom 120 to transmit and receive data between the connector 110 and the first micom 120 in response to the switching of the switch 140.

The second bus B2 is selectively connected to a third bus B3, which is connected to the second micom 130, by the switch 140.

The third bus B3 includes a third SCL SCL3 and a third SDA SDA3. The third SCL SCL3 is selectively connected to the second SCL SCL2 by the switch 140.

In the present embodiment, the first, the second, and the third buses B1, B2 and B3 are provided in I-square-C (hereafter, referred to as 'I2C' or $I^2C$) scheme/protocol; however, it should be understood that the buses B1, B2, and B3 may communicate using various other bus communication schemes/protocols.

If the second SCL SCL2 and the third SCL SCL3 are connected by the switch 140, the third SDA SDA3 transmits and receives data through the second SDA SDA2 to and from the connector 110. Accordingly, the second micom 130 is connected through the second bus B2 and the third bus B3 to the connector 110 so as to transmit and receive data to and from the program providing device 200.

The second SCL SCL2 is selectively connected to a fourth SCL SCL4, which is connected to the first micom 120, by the switch 140. If the second SCL SCL2 and the fourth SCL SCL4 are connected by the switch 140, the second SDA SDA2 transmits and receives data between the connector 110 and the first micom 120.

In other words, the switch 140 is connected to the second SCL SCL2, and electrically connects one of the third and the fourth SCL SCL3 and SCL4 to the second SCL SCL2 in response to the control signal "C" of the first micom 120. Depending on whether the second SCL SCL2 is connected to the third SCL SCL3 or the fourth SCL SCL4, it is determined which of the first micom 120 and the second micom 130 that the second SDA SDA2 is connected to. Thus, the switch 140 can regulate/manage data transmission/downloading between the program providing device 200 and the first and second micoms 120 and 130 by connecting or disconnecting respective serial clock signals of the serial clock lines (SCL1, SCL2, SCL3, and SCL4). Accordingly, depending on the switching operation of the switch 140, it is determined which of the first micom 120 and the second micom 130 is connected to the connector 110.

Here, the switch 140 connects the second SCL SCL2 and the fourth SCL SCL4 so that the data processing apparatus 100 sets a connection between the first micom 120 and the program providing device 200 to a basic connection.

As described above, the data processing apparatus 100 switches the connection between the plurality of micoms 120 and 130 and the connector 110 using the switch 140. Accordingly, the data processing apparatus 100 can individually set communication connections between the connector 110 and the micoms 120 and 130 in response to a request of the program providing device 200, without requiring a separate downloading program, or connectors for each of the first and second micoms 120 and 130. Therefore, the manufacturing cost can be minimized and the data processing apparatus 100 can be simplified.

Figure 2:
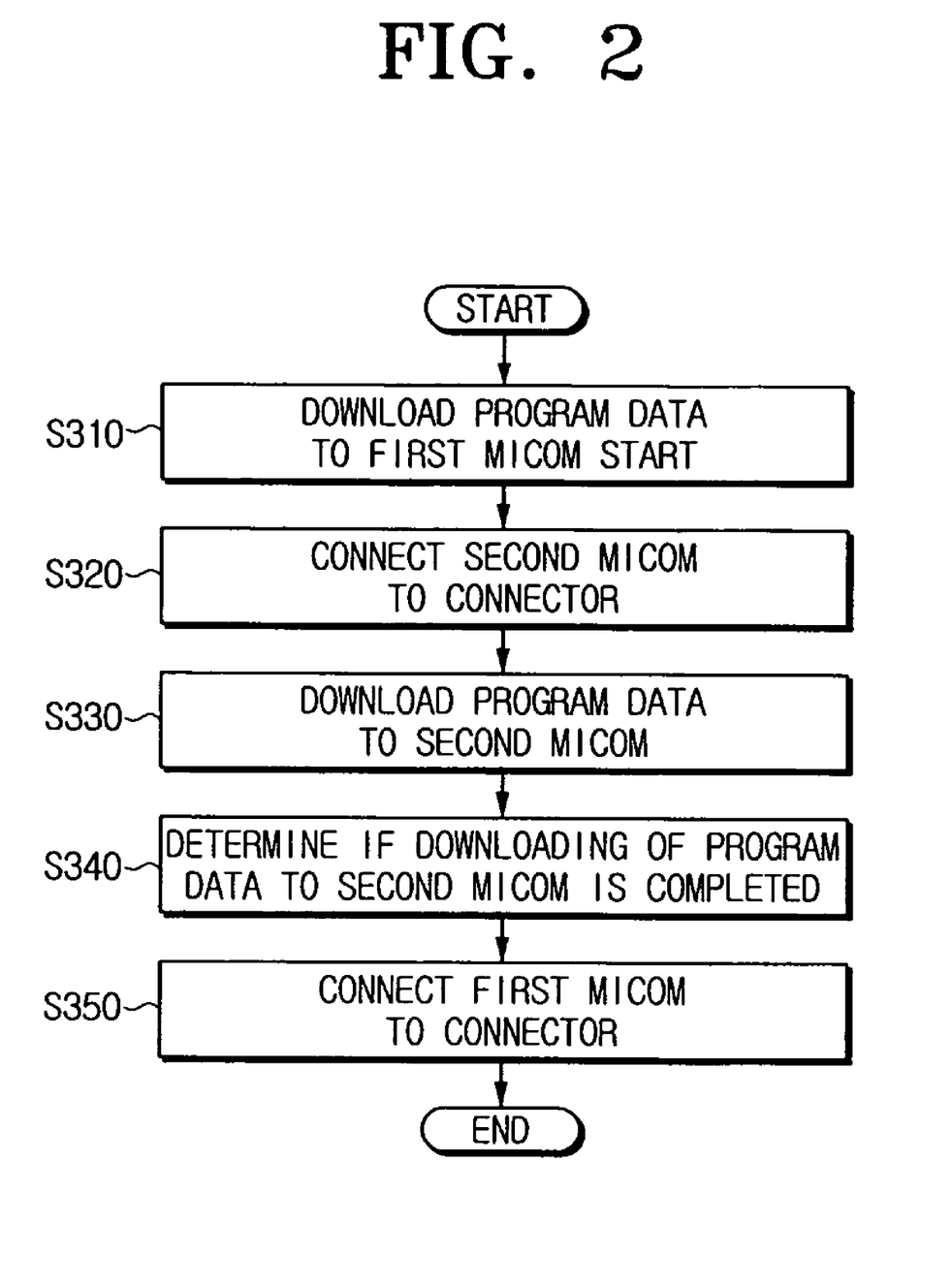
FIG. 2 is a flowchart illustrating a method of downloading program data, according to an embodiment of the present general inventive concept.

FIG. 2 is a flowchart illustrating a method of downloading the program data. The method of FIG. 2 can be performed by the data processing apparatus 100 of FIG. 1. Accordingly, for illustration purposes, the method of FIG. 2 is described below with reference to FIG. 1.

Referring to FIGS. 1 and 2, the first micom 120 downloads the program data from the program providing device 200 when the second SCL SCL2 and the fourth SCL SCL4 are connected by the switch 140 (operation S310). The first micom 120 then stores the downloaded program data. If the downloading of the program data is completed, the first micom 120 transmits the respective ID thereof (i.e., the first ID) to the program providing device 200.

In response to a request from the program providing device 200, the first micom 120 controls the switch 140 to connect the connector 110 and the second micom 130 (operation S320). The operation of connecting the connector 110 and the second micom 130 will be described below in more detail with reference to FIG. 3. In this operation, the switch 140 connects the third SCL SCL3 with the second SCL SCL2.

The second micom 130 downloads the program data from the program providing device 200 (operation S330). The operation in which the second micom 130 downloads the program data will be described below in more detail with reference to FIG. 4.

The first micom 120 detects the status value of the second micom 130 to determine whether the downloading of the operation S330 is completed by the second micom 130 (operation S340). If the downloading of the operation S330 is completed, the status value of the second micom 130 is changed or reversed. For example, if the status value is set to high before the second micom 130 downloads the program data, the status value is set to low after the second micom 130 completes the downloading of the operation S330.

Once the first micom 120 determines that the downloading of the operation S330 is completed at the operation S340, the first micom 120 controls the switch 140 to connect the connector 110 with the first micom 120 again (operation S350). In this case, the switch 140 connects the second SCL SCL2 with the fourth SCL SCL4. Accordingly, the switch 140 returns to the basic connection.

Figure 3:
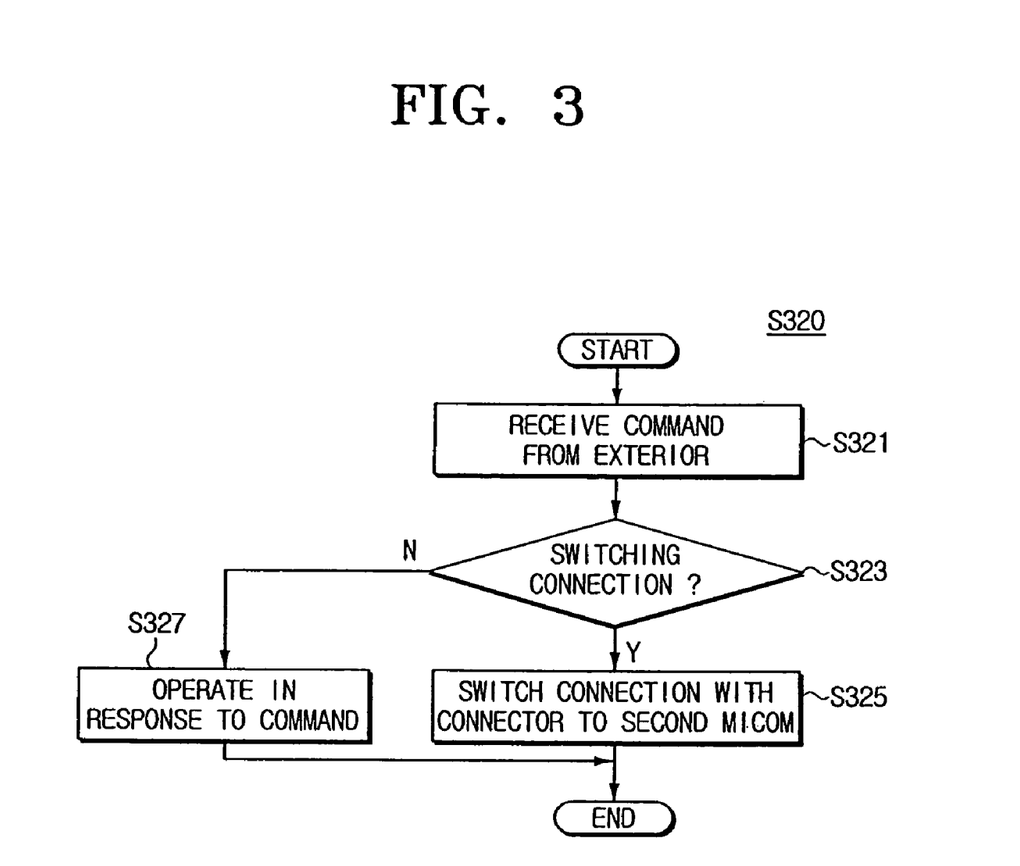
FIG. 3 is a flowchart illustrating a switching connection operation of the method of FIG. 2, according to an embodiment of the present general inventive concept.

FIG. 3 is a flowchart illustrating the switching connection operation S320 of the method of FIG. 2, in which the connector 110 and the second micom 130 are connected.

Referring to FIGS. 1 and 3, the first micom 120 receives a command from an exterior (e.g., from the program providing device 200) (operation S321).

The first micom 120 determines whether the received command is a switching command that requests the communication connection between the second micom 130 and the program providing device 200 (operation S323).

If the received command is determined to be the switching command in the operation S323, the first micom 120 controls the switch 140 to connect the connector 110 with the second micom 130. Accordingly, the switch 140 connects the second SCL SCL2 with the third SCL SCL3 (operation S325), and the second SCL SCL2 is disconnected from the fourth SCL SCL4 such that the program providing device 200 is connected to the second micom 130.

If the received command is determined not to be the switching command in the operation S323, the first micom 120 operates in response to the received command (operation S327).

Figure 4:
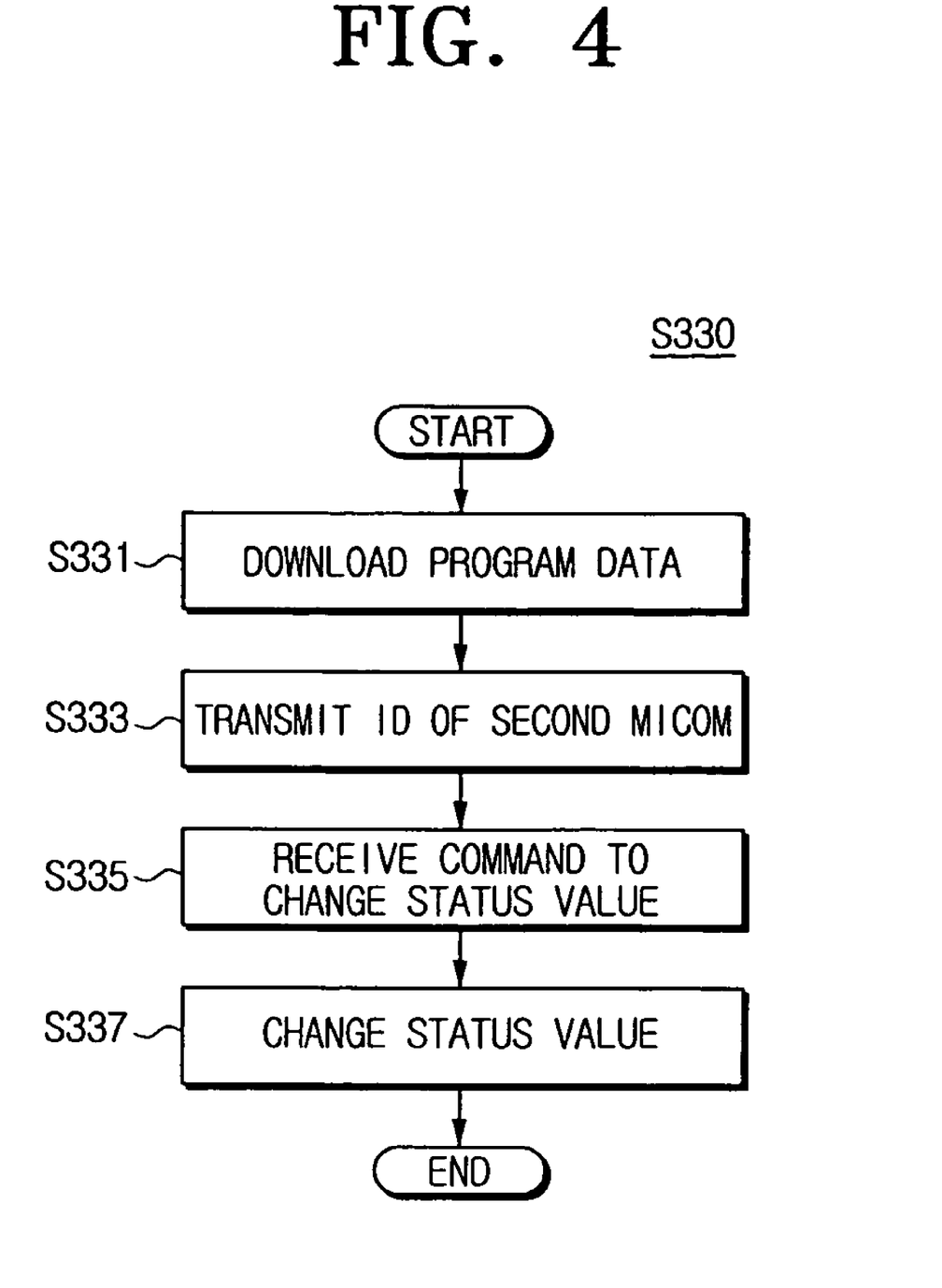
FIG. 4 is a flowchart illustrating a downloading operation of the method of FIG. 2, according to an embodiment of the present general inventive concept.

FIG. 4 is a flowchart illustrating the downloading of the program data of the operation S330 of the method of FIG. 2.

Referring to FIGS. 1 and 4, the second micom 130 is connected to the connector 110 by the switch 140 to download the program data from the program providing device 200 (operation S331).

If the downloading is completed and the program data is set in the second micom 130, the second micom 130 transmits the respective ID thereof (i.e., the second ID) to the program providing device 200 through the connector 110 (operation S333). Accordingly, the program providing device 200 can recognize that the downloading to the second micom 130 is successfully completed.

The second micom 130 then receives a status change command to change the status value thereof from the program providing device 200 (operation S335).

The second micom 130 then changes the current status value (operation S337) in response to the received command. Accordingly, the first micom 120 can recognize that the program data downloading operation (i.e., the operation S330) of the second micom 130 is completed.

Figure 5:
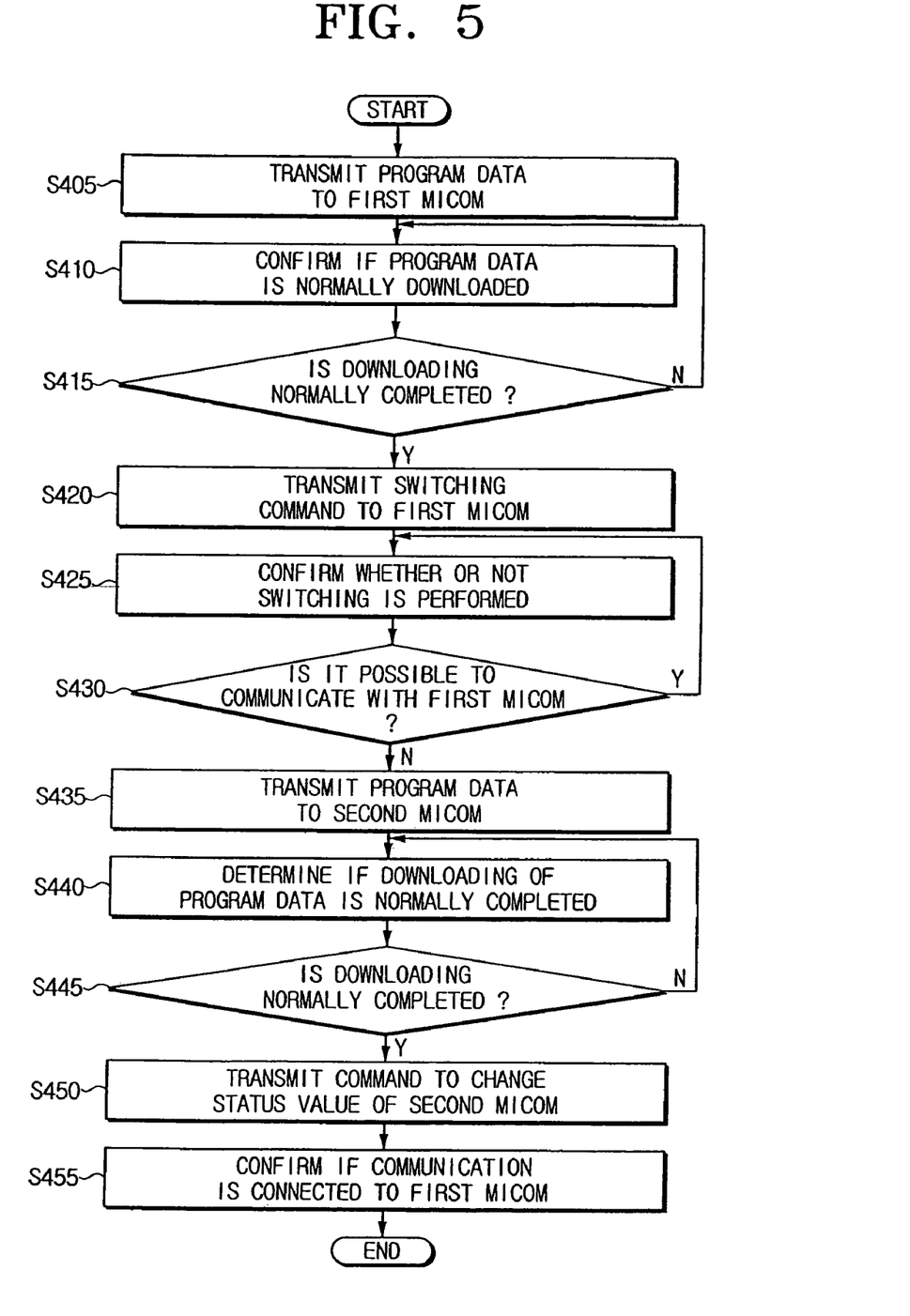
FIG. 5 is a flowchart illustrating a method of providing program data to a data processing apparatus, according to an embodiment of the present general inventive concept.

FIG. 5 is a flowchart illustrating a method of providing the program data to the data processing apparatus 100. The method of FIG. 5 may be performed by the program providing device 200. Accordingly, for illustration purposes, the method of FIG. 5 is described below with reference to FIG. 1.

Referring to FIGS. 1 and 5, the program providing device 200 transmits the program data to the data processing apparatus 100, and the received program data is stored in the first micom 120 (operation S405). Accordingly, the program data is set in the first micom 120. Here, the switch 140 sets the connection between the connector 110 and the first micom 120 to the basic connection. Thus, when the program providing device 200 is connected to the data processing apparatus 100 and the program data is received from the program providing device 200, the data is automatically stored in the first micom 120.

The program providing device 200 receives an ID of a currently-connected micom from the data processing apparatus 100 to determine whether the program downloading operation is completed (operation S410).

The program providing device 200 then determines whether the received ID is that of the first micom 120 (i.e., the first ID) (operation S415).

If the received ID is determined not to be that of the first micom 120 in the operation S415, the program providing device 200 feeds back from the operation of S415 to the operation S410. In other words, the program providing device 200 can repeatedly determine whether the received ID is the ID that corresponds to the first micom 120 in order to determine whether the program data transmission operation (i.e., the operation S405) is complete.

If the received ID is determined to be that of the first micom 120 (i.e., the first ID) in the operation S415, the program providing device 200 transmits the switching command to the first micom 120 in order to request the communication connection with the second micom 130 (S420).

The program providing device 200 receives the ID of the currently-connected micom (i.e., the first or second micoms 120 or 130) from the data processing apparatus 100 (operation S425) indicating which of the micoms 120 or 130 to which the program providing device 200 is connected through the connector 110. The program providing device 200 determines whether the received ID is that of the first micom 120 (i.e., the first ID) (operation S430).

If the received ID is determined to be that of the first micom 120 in the operation of S430, the program providing device 200 recognizes that the communication connection with the second micom 130 is not set at the operation S425. Accordingly, the program providing device 200 waits for the connection with the second micom 130 or transmits an error message.

If the received ID is determined not to be that of the first micom 120 in the operation S430, the program providing device 200 recognizes that the communication is disconnected from the first micom 120 and that the communication is connected to the second micom 130. Accordingly, the program providing device 200 transmits the program data to the second micom 130 (operation S435).

When the downloading is completed, the program providing device 200 receives the ID of the currently-connected micom from the data processing apparatus 100 to indicate whether the downloading of the program data to the second micom 130 is completed (operation S440).

The program providing device 200 then determines whether the received ID is that of the second micom 130 (operation S445). If the received ID is determined not to be that of the second micom 130, the program providing apparatus 200 waits to receive the second ID to indicate completion of the downloading/transmission operation at the operation S440, or transmits an error message.

If the received ID is determined to be that of the second micom 130 in the operation S445, the program providing device 200 determines that the program data is set in the second micom 130, and transmits the status change command to the second micom 130 in order to change the status value of the second micom 130 (operation S450).

The program providing device 200 then receives the ID of the currently-connection micom from the data processing apparatus 100 to determine whether the connection is set again with the first micom 120 (operation S455).

As described above, a data processing apparatus according to embodiments of the present general inventive concept has a switch to switch a connection between a plurality of micoms and one connector in response to a request of the program providing device. In response to the switching of the switch, each micom is connected to the program providing device to download program data. Accordingly, the data processing apparatus does not require a connector for each micom to be connected to the program providing device, and does not require a separate program for one connector to be connected to the plurality of micoms. Therefore, a manufacturing cost can be minimized, and a structure of the data processing apparatus can be simplified.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A data processing apparatus connected to an external program providing device to provide program data, the apparatus comprising: a connector connected to the external program providing device to transmit and receive program data to and from the external program providing device; a first In System Programming (ISP) device to store the program data received from the external program providing device through the connector; at least one second ISP device connected to the first ISP device to store the program data received from the external program providing device through the connector; and at least one switch connected to the connector to switch a connection between the connector and the first and the second ISP devices so that one of the first and the second ISP devices is connected to the connector in response to a control of the first ISP device, wherein the second ISP device has a status value that varies depending on whether the program data is downloaded therein, and the first ISP device detects the status value of the second ISP device to determine a current status of the second ISP device, wherein the first ISP device controls the at least one switch according to the current status of the second ISP device.

2. The data processing apparatus as claimed in claim 1, further comprising:
a first signal line part connected to the connector;
a second signal line part connected to the second ISP device; and
a third signal line part connected to the first ISP device,
wherein the switch is connected to the first signal line part to switch a connection of the first signal line part to one of the second and the third signal line parts.

3. The data processing apparatus as claimed in claim 2, wherein the switch sets a connection between the first signal line part and the third signal line part to a basic connection.

4. A data processing apparatus, comprising: a first ISP device; a second ISP device to communicate with the first ISP device; a connector connectable to an external device; a data line connected between the connector and the first and second ISP devices; a clock line selectively connected between the connector and one of the first and second ISP devices according to a control from the first ISP device; and a switch disposed on the clock line between the connector and the first ISP device to selectively connect the connector to one of the first ISP device and the second ISP device according to a status value provided by the second ISP device.

5. A data processing apparatus, comprising: a connector having first clock and data lines connectable to an external device; a first ISP device; a second ISP device; second clock and data lines connected to the first clock and data lines of the connector, respectively, the second data line connected to the first ISP device; third clock and data lines connected to the second ISP device, the third data line connected to the second data line; and a fourth clock line connected to the first ISP device; a switch connected to the second clock line, the fourth clock line, and the third clock line, wherein the first ISP device controls the switch to connect the second clock line to one of the fourth clock line and the third clock line according to a status value provided by the second ISP device.

6. The data processing apparatus as claimed in claim 5, wherein:
the switch comprises a first terminal connected to the second clock line, a second terminal connected to the fourth clock line, and a third terminal connected to the third clock line; and
the first ISP device controls the switch to connect the first terminal to one of the second and the third terminals.

7. A data processing apparatus to execute program data, the apparatus comprising:
a plurality of micro computers to download a plurality of corresponding program data from a program data providing device;
a connector connectable to the program data providing device; and
a switch to establish a connection between the connector and a selected one of the micro computers such that the selected one of the micro computers communicates with the program data providing device,
wherein a predetermined one of the micro computers manages operation of the switch with respect to the other micro computers according to a status value provided by at least one of the other microcomputers.

8. The apparatus as claimed in claim 7, further comprising:
a data line connected between the connector and the plurality of micro computers; and
a clock line connected between the connector and the plurality of micro computers,
wherein the connector comprises a connector of the clock line to selectively connect the connector to the selected one of the micro computers.

9. A data processing apparatus, comprising: a plurality of micro computers; a connector to communicate with a program data providing device outside of the apparatus; and a switch having a plurality of switching terminals and being interposed between the micro computers and the connector and to selectively connect the micro computers to the connector, wherein the plurality of micro computers comprise: one or more non-control micro computers having corresponding status indicators to indicate whether a downloading process is being performed thereby; and a control micro computer to control the switch to selectively connect one of the control or non-control micro computers to the connector according to the status indicators of the non-control micro computers.

10. The apparatus as claimed in claim 9, wherein the plurality of micro computers comprise:
a first micro computer to receive one or more commands from the program data providing device and to control the switch based on the received commands; and
a second micro computer to be selectively connected to the connector by the switch.

11. The apparatus as claimed in claim 10, wherein when the first micro computer receives a switching command, the first micro computer controls the switch to switch a connection between a currently connected micro computer and the connector.

12. The apparatus as claimed in claim 9, wherein each of the micro computers has a corresponding ID and transmits the ID to the program data providing device whenever the corresponding ones of the micro computers are connected to the connector to communicate with the program data providing device.

13. The apparatus as claimed in claim 12, wherein the program data providing device recognizes a current micro computer that is connected to the connector according to the corresponding ID that is received through the connector.

14. The apparatus as claimed in claim 9, wherein each of the micro computers includes a corresponding serial data line connected to the connector to bypass the switch and a corresponding serial clock line connected to the switch such that the switch selectively connects the serial clock line of a selected one of the micro computers with a serial clock line of the connector to establish a communication connection between the selected micro computer and the program data providing device.

15. The apparatus as claimed in claim 9, wherein the plurality of micro computers sequentially download corresponding program data from the program data providing device.

16. The apparatus as claimed in claim 15, wherein the micro computers provide a corresponding external status indicator to the program data providing device and update a corresponding internal status indicator when the downloading is complete.

17. A control micro computer to manage communication between a data processing apparatus and an external program providing device, the data processing apparatus having a plurality of micro computers including the control micro computer installed therein, a connector, and a switch connected to the connector and selectively connected to the plurality of micro computers, wherein the control micro computer manages the communication by controlling the switch to connect a selected one of the micro computers with the connector according to one or more status indicators of the plurality of micro computers provided by at least one of the plurality of micro computers to the control micro computer and one or more commands received from the external program providing device.

18. A method of setting program data in a data processing apparatus connected to an external program providing device to provide the program data, the method comprising: downloading the program data received through a connector from the external program providing device to a first ISP device connected to the connector; if the downloading to the first ISP device is completed, the first ISP device controlling a switch according to a status value provided by a second ISP device to switch a first connection between the connector and the first ISP device to a second connection between the connector and the second ISP device to connect the second ISP device with the external program providing device through the connector; and sending a changed current status value of the second ISP device to the first ISP device to indicate whether the program data of the external device is set in the second ISP device.

19. The method of setting program data as claimed in claim 18, further comprising:
detecting the status value of the second ISP device to confirm a downloading completion of the second ISP device; and
switching a connection between the connector and the second ISP device to connect the connector to the first ISP device.

20. A method of controlling a data processing apparatus having a plurality of micro computers, a connector connected with a program data providing device outside of the apparatus, and a switch interposed between the micro computers and the connector to selectively connect the micro computers to the connector, the method comprising: a first micro computer controlling the switch to selectively connect a selected one of the micro computers to the connector in response to one or more commands received from the program data providing device and one or more status indicators corresponding to the micro computers to indicate whether program data of the program data providing device is set in the selected one of the micro computers.

21. A data processing apparatus connected to an external program providing device to provide program data, the apparatus comprising:
a plurality of microcomputers to selectively receive program data from the external program providing device and to communicate with each other; and
a switch to select which of the plurality of the microcomputers receives the program data, such that one of the plurality of microcomputers operates the switch with respect to the remainder of the plurality of microcomputers according to a status indicator provided by one of the remainder of the plurality of microcomputers.

22. The data processing apparatus of claim 21, further comprising:
a connector to connect the external program providing device to the plurality of microcomputers, such that the switch allows only selected one of the plurality of microcomputers to be connected to the external program providing device.

23. A data processing apparatus connected to an external program providing device to provide program data, the apparatus comprising: a first microcomputer; a second microcomputer connected to the first microcomputer; a connector to establish a basic connection between the external program providing device and the first microcomputer; and a switch to exclusively connect one of the first microcomputer and the second microcomputer to the external program providing device in response to a request by the external program providing device and a status indicator provided by the second microcomputer to the first microcomputer, wherein the switch is controlled by the first microcomputer.

24. A data processing apparatus connected to an external program providing device to provide program data, the apparatus comprising: a connector connected to the external program providing device to transmit and receive program data to and from the external program providing device; a first In System Programming (ISP) device to store the program data received from the external program providing device through the connector; at least one second ISP device to store the program data received from the external program providing device through the connector; and a switch connected between the first ISP device and the second ISP device, wherein the second ISP device outputs a status value to the first ISP device, and the first ISP device, in response to the status value, outputs a signal to the switch to change the connection between a first line to connect to the first ISP device and a second line to connect to the second ISP device.

* * * * *